United States Patent
Agoston et al.

(10) Patent No.: US 6,998,834 B2
(45) Date of Patent: Feb. 14, 2006

(54) REAL-TIME TIME DRIFT ADJUSTMENT FOR A TDR STEP STIMULUS

(75) Inventors: Maria Agoston, Beaverton, OR (US); Kenneth J. Lester, Sherwood, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/852,924

(22) Filed: May 24, 2004

(65) Prior Publication Data

US 2005/0200347 A1    Sep. 15, 2005

Related U.S. Application Data

(60) Provisional application No. 60/553,479, filed on Mar. 15, 2004.

(51) Int. Cl.
G01R 13/14 (2006.01)
G01R 35/00 (2006.01)
G01R 13/00 (2006.01)

(52) U.S. Cl. .................. 324/76.15; 324/642; 324/601; 702/66; 702/67

(58) Field of Classification Search ............ 324/76.15, 324/601, 637, 642, 646; 702/85, 89, 66, 702/67, 71
See application file for complete search history.

(56) References Cited

U.S. PATENT DOCUMENTS

| | | | | |
|---|---|---|---|---|
| 3,693,080 A | * | 9/1972 | Ross et al. | 324/638 |
| 5,309,484 A | * | 5/1994 | McLane et al. | 375/354 |
| 5,841,288 A | * | 11/1998 | Meaney et al. | 324/639 |
| 6,650,874 B1 | * | 11/2003 | Banik et al. | 455/71 |
| 6,721,372 B1 | * | 4/2004 | Banik et al. | 375/344 |

FOREIGN PATENT DOCUMENTS

JP        2002098723 A  *  4/2002

* cited by examiner

Primary Examiner—Anjan Deb
Assistant Examiner—John Zhu
(74) Attorney, Agent, or Firm—William K. Bucher

(57) ABSTRACT

A method for reducing drift in a step stimulus from a sampling system, such as an oscilloscope, is described having an initial step of setting a calibration repetition rate. A step stimulus stabilization calibration is performed to acquire a reference mid-crossing time and the current mid-crossing time. Acquisition cycles of TDR/TDT waveform samples are acquired equal to the repetition rate with the initial strobe delay interval in the sampling system being adjusted by the difference between the reference mid-crossing time and the current mid-crossing time. The step stimulus stabilization calibration is performed again to acquire a new current mid-crossing time and initial strobe delay interval and more acquisition cycles of TDR waveform samples are acquired equal to the repetition rate. The process continues until a stop command is activated for the sampling system.

5 Claims, 7 Drawing Sheets

REAL-TIME TIME DRIFT ADJUSTMENT FOR A TDR STEP STIMULUS

CROSS-REFERENCE TO RELATED APPLICATION

This application claims the benefit of the U.S. Provisional Application No. 60/553,479, filed Mar. 15, 2004.

BACKGROUND OF THE INVENTION

The present invention relates generally to time domain reflectometry measurements and more particularly to a method of reducing time drift of a step stimulus originating from a sampling system, such as an oscilloscope.

Time domain reflectometry (TDR) and time domain transmission (TDT) measurements on a device under test (DUT) are performed with an oscilloscope by applying a step stimulus to the DUT and acquiring the transmitted step stimulus and the reflected signal from the DUT. The step stimulus provides an incident pulse with the reflected pulse depending on the impedance in the DUT. For a rising step stimulus, an ideal reflected response would be a matching rising step stimulus delayed in time for a DUT having an open termination. An ideal matching falling step stimulus delayed in time represents a DUT having a shorted termination. A response having no change in amplitude over time represents a DUT having an impedance mating the step source impedance. In actual use, the reflected response may include more than one change in the impedance of the DUT as represented by various signal level changes in the reflected signal.

Electrical drift occurs within an oscilloscope due to environmental conditions, such as temperature and airflow. Drift can also occur due to operational characteristics of analog and digital components used in the system. When drift occurs, the step stimulus displayed on an oscilloscope will shift position to the right or left on the display relative to the time reference point. The shift can be thought of as a change in the timing of the system (i.e oscilloscope). Under normal usage, the waveform can be "moved" in a similar fashion by changing the horizontal position controls on the oscilloscope or the step positioning control. However, drift is when the waveform move without changes in the control parameters.

When a step signal is used for the characterization of a DUT, time stability is critical for several reasons. Any drift in the TDR step stimulus will limit the ability to enhance the accuracy and resolution of the TDR/TDT measurements by calibration and post-processing of the acquired data. In order to improve the accuracy and resolution of a TDR measurement, the effects of the interconnect to the DUT needs to be removed through a calibration process. Some of the aberrations due to the interconnect can be removed by applying the step stimulus to a standard reference impedance (typically 50 ohms). This reference waveform carries the signature of the interconnect, and can be subtracted from the data reflected from the DUT. If a time drift shifts the position of the step, the interconnect aberrations on the two waveforms will not match, thus the subtraction operation will amplify the effects of the aberrations rather than reduce them. When a mismatched difference waveform is applied for further processing, the resulting waveform will show excess ringing, thus reducing the accuracy of the measurement.

The accuracy of rise time measurements could be affected by the time drift of the step. The TDR resolution is directly proportional with the rise time of the step, thus rise time measurements are fundamental for TDR/TDT characterization. The need to reduce noise and effects of jitter impose the requirement to heavily average the data acquired from the DUT. Depending on the average count and rate of drift, the rise time measurements will loose accuracy when the step edge drifts.

What is needed is a method to minimize or significantly reduce drift of a step stimulus from an oscilloscope for more accurate TDR/TDT measurements.

SUMMARY OF THE INVENTION

Accordingly, the present invention is a method for reducing drift in a step stimulus provided to a sampling system, such as an oscilloscope. After an initial step of setting a calibration repetition rate, a first step stimulus stabilization calibration is performed on acquired step stimulus waveform samples to generate a reference mid-crossing time and a current mid-crossing time for the step stimulus. An initial strobe delay interval in the sampling system is adjusted using the difference between the reference mid-crossing time and the current mid-crossing time. Acquisition cycles of TDR/TDT waveform samples are acquired equal to the repetition rate using the adjusted initial strobe delay interval. At the conclusion of the acquisition cycles of TDR/TDT waveform samples, a further step stimulus stabilization calibration is performed on a new set of acquired step stimulus waveform samples to generate a new current mid-crossing time. The initial strobe delay interval in the sampling system is adjusted using the difference between the reference mid-crossing time and the new current mid-crossing time. Acquisition cycles of TDR/TDT waveform samples are acquired again equal to the repetition rate using the adjusted initial strobe delay interval and the step stimulus stabilization calibration is performed again. The difference between the reference mid-crossing time and the current mid-crossing time may be stored and used for adjusting the initial strobe delay interval for each of the acquisition cycles of TDR/TDT waveform samples.

The step stimulus stabilization calibration performing step includes the step of acquiring step stimulus waveform samples at a first sample interval and determining a mid-crossing point in a step stimulus edge correlated in time. A baseline acquisition window is set and step stimulus waveform samples are acquired for determining a base line mean over the baseline acquisition window. A step stimulus edge acquisition window is set that is centered on the mid-crossing point in the step stimulus edge correlated in time and step stimulus waveform samples are acquired at a second sample interval smaller than the first sample interval. A mid-crossing point is determined in a step stimulus edge correlated in time and a rise time is determined for the step stimulus edge over a selected portion of the step stimulus edge. Another step stimulus edge acquisition window is set based on the rise time of the step stimulus edge and step stimulus waveform samples are acquired at a third sample interval smaller than the second sample interval. A mid-crossing point is determined in a step stimulus edge correlated in time within the acquisition window. When the step stimulus stabilization calibration is initially performed, the mid-crossing point in a step stimulus edge using the third sample interval is stored as the reference mid-crossing point and the current mid-crossing point. When the step stimulus stabilization calibration is performed subsequently, the mid-crossing point in a step stimulus edge using the third sample interval is stored as the current mid-crossing point.

The mid-crossing point determination in a step stimulus edge using the second sample interval has the additional step of applying a smoothing filter on the step stimulus waveform samples in the step stimulus edge acquisition window. The determination of the rise time of the step stimulus edge has the additional step of establishing the selected portion of the step stimulus edge as 25% to 75% of the step stimulus edge. The mid-crossing point determination in a step stimulus edge using the third sample interval has the additional step of performing a linear regression function on the step stimulus waveform samples in the step stimulus edge acquisition window.

The objects, advantages and novel features of the present invention are apparent from the following detailed description when read in conjunction with appended claims and attached drawings.

BRIEF DESCRIPTION OF THE DRAWING FIGURES

FIGS. 4A through 4C is a representative flow chart of the TDR/TDT edge stabilization calibration algorithm.

DETAILED DESCRIPTION OF THE PREFERRED EMBODIMENT

Part of the description will be presented in terms of operations performed by a digitizing instrument, using terms such as data, values, signal samples, numbers and the like, consistent with the manner commonly employed by those skilled in the art to convey the substance of their work to others skilled in the art. As is well understood by those skilled in the art, these quantities take the form of electrical signals capable of being stored, transferred, combined and otherwise manipulated through mechanical and electrical components of a digitizing instrument and the term digitizing instrument includes general purpose as well as special purpose data processing machines, systems, and the like, that are stand alone, adjunct or embedded.

Additionally, various operations will be described as multiple discrete steps in turn in a manner that is most helpful in understanding the present invention, however, the order of description should not be construed as to imply that these operations are necessarily order dependent, in particular, the order of their presentation.

Figure 1:
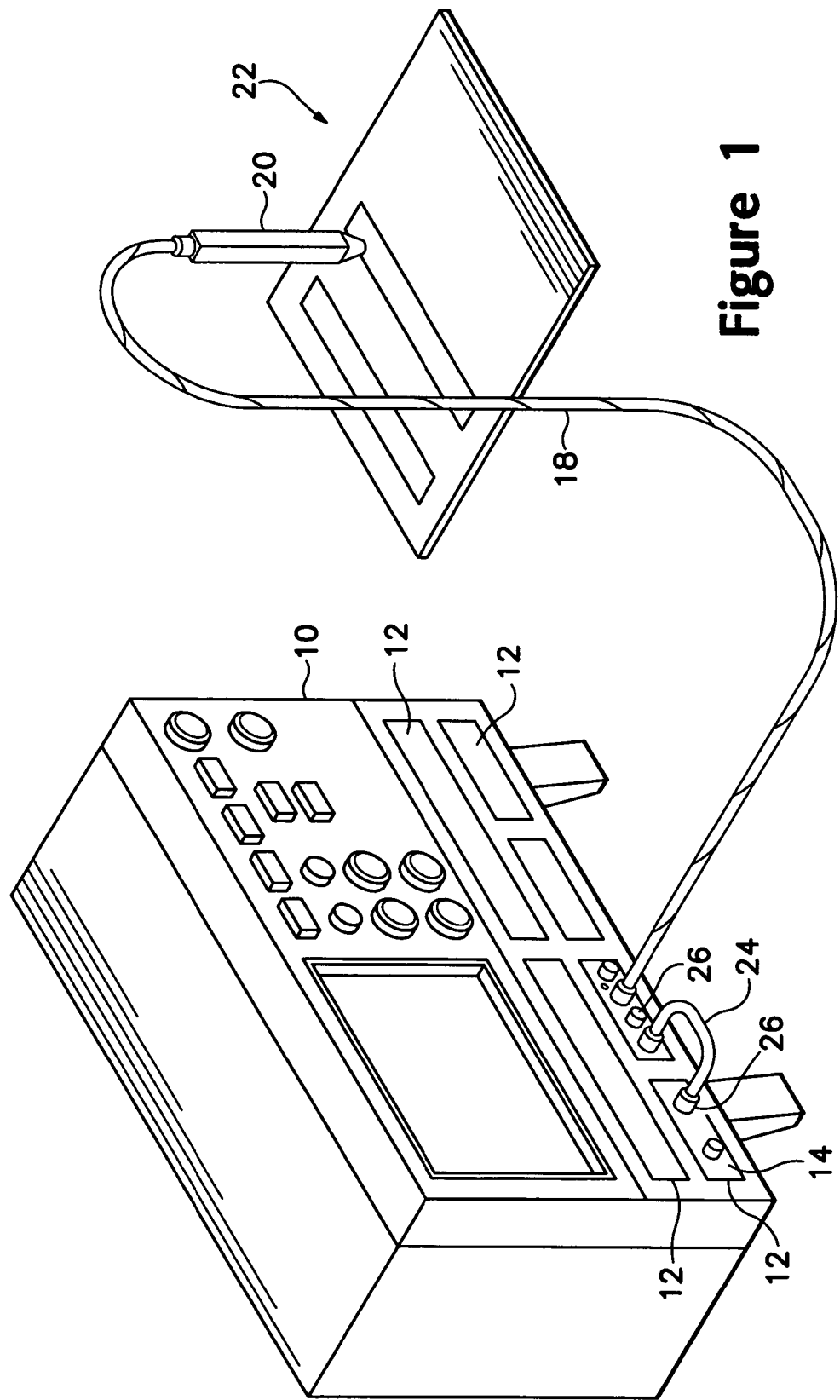
FIG. 1 is a perspective view of a sampling oscilloscope incorporating the method of real-time time drift adjustment for a TDR step stimulus according to the present invention.

Referring to FIG. 1, there is shown a representative view of a sampling oscilloscope 10, such as the TDS8000 Sampling Oscilloscope, manufactured and sold by Tektronix, Inc., Beaverton, Oreg. The sampling oscilloscope 10 has a modular architecture that includes multiple bays 12 for receiving various types of optical and electrical plug-in modules 14. The bays 12 provide power, control signals and signal output for the modules. One such module is the 80E04 TDR Sampling Head that is usable for making TDR measurements. The sampling head 14 has one or more input terminals 16 coupled to sampling diodes and is terminated in 50 ohms with low parasitic capacitance. The input terminals 16 may be coupled directly to one end of a coaxial cable 18 whose other end is coupled to a measurement probe 20. The measurement probe 20 is used to probe a device under test (DUT) 22. Alternately, the input terminal may be coupled via a coaxial cable 24 to a control module 26 inserted into one of the bays 12 of the oscilloscope 10. The coaxial cable 18 and the measurement probe 20 are then coupled to the control module 26. The control module 26 provides input protection for the sampling diodes so that they are not damaged or destroyed by electrostatic discharge.

Figure 2:
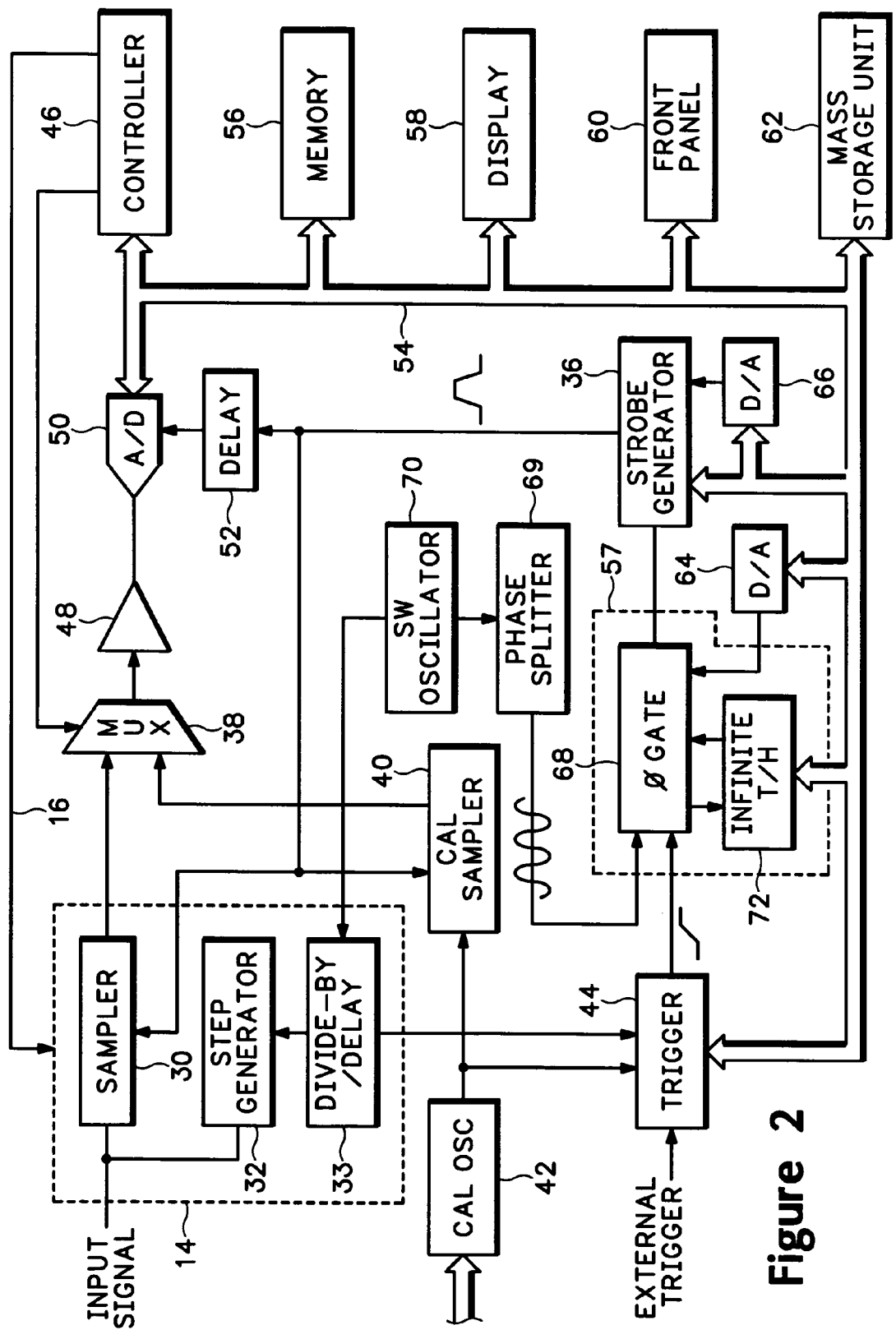
FIG. 2 is a representative block diagram of a sampling oscilloscope incorporating the method of real-time time drift adjustment for a TDR step stimulus according to the present invention.

Referring to FIG. 2, there is shown a representative block diagram of a sampling oscilloscope implementing the method of real-time time drift adjustment for a TDR step stimulus. The TDR sampling head 14 includes a sampler 30 receiving an input signal that includes a step stimulus from a step generator 32 and a return reflected pulse from the DUT 22. The TDR sampling head 14 further includes a divide-by/delay circuit 33 that receives a sinusoid input signal from a continuous wave oscillator 70. The divide-by circuit within the divide-by/delay circuit 33 divides the continuous wave input signal which is coupled to a delay circuit within the divide-by/delay circuit 33 and a trigger circuit 44 as a TDR sampling head trigger. The delay circuit provides a suitable delay to the divided signal to allow the sampling oscilloscope to trigger prior to the generation of the step stimulus by the step generator 32. The divided-delay signal from the divide-by/delay circuit 33 is applied to the step generator 32. The step generator 32 generates a step pulse in response to the divided-delay signal. A control line couples the TDR sampling head 16 to a controller 46 for initiating the generation of step pulses in response to user activated front panel controls.

The input signal to the TDR sampling head 14 is coupled to the sampling diodes within the sampler 30 that sample the signal in response to a sampling strobe from a strobe generator 36. The sampler 30 may include strobe shaping circuitry that shapes the strobe pulses and generates differential strobe pulses. A track-and-hold circuit within the sampler 30 holds the sampled signal. The sampled signal is coupled to one input of a multiplexer (MUX) 38. A second input to the MUX 38 receives a held sampled output of a calibration sampler 40. The calibration sampler 40 receives a signal input from a programmable calibration oscillator 42 that is coupled to a sampling bridge in the calibration sampler 40. The sampling bridge is strobed by strobe pulses from the strobe generator 36 with the sampled oscillator input being held by a track-and-hold circuit. As with the sampler 30, the calibration sampler 40 may include strobe shaping circuitry that shapes the strobe pulses and generates differential strobe pulses. Alternately, the strobe generator 36 may include the shaping and differential circuitry for the strobe pulses. The calibration oscillator 42 output is also coupled to an input of the trigger circuit 44.

The MUX 38 receives control signals from the controller 46 that selectively couples the held input signal samples or the held calibration signal samples to a buffer amplifier 48 via the MUX output. The buffer amplifier 48 conditions the samples for input to an analog-to-digital (A/D) converter 50. The A/D converter 50 is clocked by digitizing strobes generated by the strobe generator 36 and applied to the A/D converter 50 via a delay circuit 52. The digitized samples at the output of the A/D converter 50 are coupled to a system bus 54 and stored in system memory 56 for further processing and displaying.

System memory 56 includes both RAM, ROM and cache memory with the RAM memory storing volatile data, such as the digitized values representative of the input signal, phase values from a phase startable clock device 57, look-up tables and the like. The system bus 54 couples memory 56 to the controller 46, such as PENTIUM® or Celeron™ microprocessor, manufactured and sold by Intel, Corp., Santa Clara, Calif. The system bus 54 is also coupled to a display device 58, such a liquid crystal display, cathode ray tube or the like, and front panel controls 60 with buttons, rotatable knobs and the like and/or control entry devices, such as a keyboard and/or mouse. A mass storage unit or units 62, such as a hard disk drive, a CD ROM drive, a tape drive, a floppy drive or the like, that reads from and/or writes to appropriate mass storage media, may also be connected to the system bus 54. Program instructions that control the functions of the digitizing instrument may be stored and accessed from the ROM memory 56 or from the mass storage media of the mass storage unit 62. The digitizing instrument 30 in the preferred embodiment of the invention is a PC based system controlled under WINDOWS® 98 operating system, manufactured and sold by Microsoft, Corp., Redmond, Wash. Controller 46 in the block diagram is representative of multiple controller used in the digitizing instrument 30. A separate controller is used to control the acquisition of digitized samples, with DSP controllers processing the signal samples and passing the processed samples to the control processor for display on display device 58.

The system bus 54 is also coupled to the trigger circuit 44, the phase startable clock device 57 and digital-to analog (D/A) converters 64 and 66. The trigger circuit 44 is also coupled to receive an external trigger signal in addition to the calibration oscillator output signal and the TDR sampling head trigger from the divide-by/delay circuit 33. The trigger circuit 44 selectively couples under program control the trigger input signal, the calibration oscillator signal or the TDR sampling head trigger to the phase startable clock device 57. A phase gate 66 in the phase startable clock device 57 receives the output from the trigger circuit 44. The edges of the trigger circuit output signal drive track-and-hold circuitry in the phase gate 68. The phase gate 68 also receives a phase shifted sinusoidal input signals from a phase splitter 69. The phase splitter 69 is coupled to receives the sinusoidal input from the continuous wave oscillator 70. An infinite track-and-hold circuit 72 receives phase values from the phase gate 68 and couples replicas of the phase values back to the phase gate 68. The D/A converter 64 is coupled to the phase gate 68 to provide offset and gain correction values to the phase startable clock device 57. In the preferred embodiment, the gain and offset correction values are provided by separate D/A converters.

The phase startable clock device 57 generates an output signal having a predetermined startup phase relative to the trigger input signal. The output signal is conditioned as a clock signal and coupled to the strobe generator 36 for establishing a coarse time delay relative to the trigger pulse. The controller 46 under program control loads a coarse delay count value into a strobe delay counter in the strobe generator 36. The clock signal increments the count value in the counter until the terminal count is reached where upon a coarse strobe is generated. The coarse strobe from the strobe delay counter is applied to a fine time delay vernier circuit having ramp circuit that generates a ramping output signal equal to the time interval between the coarse clock pulses. The controller 46 generates a fine time delay value that is coupled via the system bus to the D/A converter 66. The D/A converter 66 converts the fine time delay value to an analog value that is applied to the vernier circuit. The analog fine time delay value in conjunction with the vernier ramp circuit and the coarse time delay generates the timed output strobe pulses from the strobe generator 36.

The method of real-time time drift adjustment for a TDR step stimulus is accomplished by periodically measuring the time position of the incident edge of the step stimulus and comparing this against a reference time position to calculate an adjustment that is applied to the strobe generator 36 of the oscilloscope 10. These measurements and adjustments are made in real time (i.e. during the normal oscilloscope operation, and without being observable to the user or requiring user interaction).

The TDR edge stabilization calibration is performed periodically with the initial calibration being performed when the oscilloscope is placed into the run mode and thereafter after a selected number of acquisition cycles. In the preferred embodiment, the frequency of performing the edge stabilization calibration is set within the algorithm but may be programmable and set by the user using front panel controls or sent to the oscilloscope by an external controller, such as a computer. An acquisition cycle acquires digital data samples for a waveform display. In the preferred embodiment, each acquisition cycle generates digital data samples for each channel that is TDR enabled by the user. Calibration occurs for each channel and consists of the following steps for each channel running in TDR mode. In the below description, various voltage levels, acquisition times, resolutions and the like are used. It is understood that these values are representative in nature and other values may equally be used in implementing the present invention.

Figure 3:
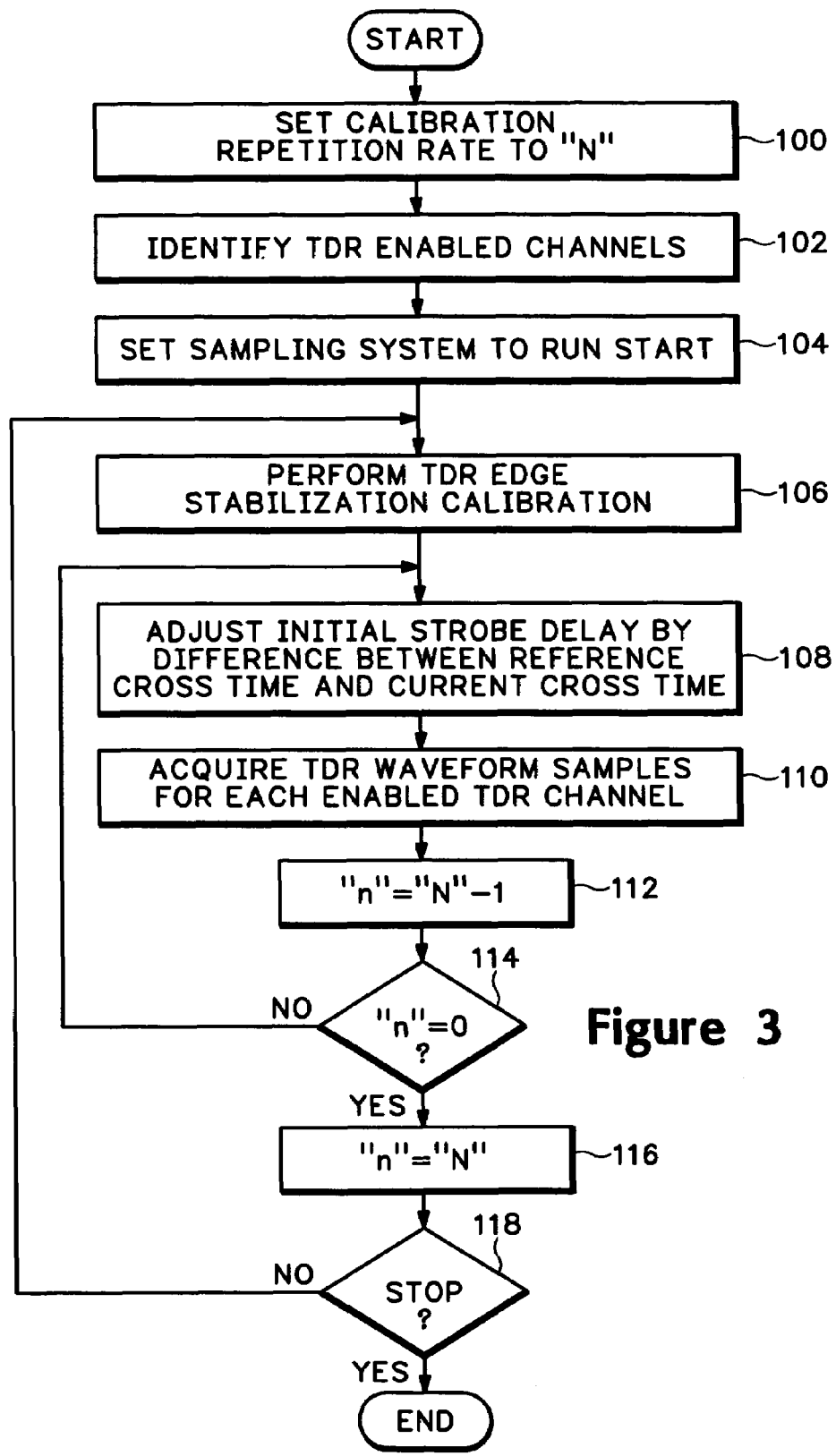
FIG. 3 is a representative flow chart of the TDR/TDT edge stabilization calibration incorporated into TDR waveform acquisitions in a TDR/TDT sampling system according to the present invention.

Referring to FIG. 3, there is shown a representative flow chart of the TDR/TDT edge stabilization calibration incorporated into TDR waveform acquisitions in a TDR/TDT sampling system, such as a sampling oscilloscope. At step 100, the calibration repetition rate is set to "N" by a preset "N" value within the TDR/TDT edge stabilization algorithm or a user set "N" value from the front panel 60 or an external controller. The TDR enabled channels of the sampling system are identified by the system in step 102. The sampling system is set to run in step 104 which starts the acquisitions of waveform samples. In step 106 the TDR edge stabilization calibration is performed on each active TDR channel. The results of the TDR edge stabilization calibration provides a reference crossing time and current crossing time that is used to adjust the initial strobe delay for each waveform acquisition cycle as represented in step 108. After the TDR edge stabilization calibration is performed, the sampling system acquires TDR waveform samples for each active TDR enabled channel as shown in step 110. After each acquisition cycle of waveform samples are acquired, the value of calibration repetition rate is decremented by "1" as depicted in step 112. Alternately, a value of "m" may be set to zero, and incremented to "N". In decision step 114, if "n"

is not equal to "0", another acquisition cycle of TDR waveform samples are acquired for each active TDR waveform channel. If the value of "n" equals "0", the value of "n" is reset to "N" as depicted in step 116. In decision step 118, if the acquisition of TDR waveform samples by the oscilloscope 10 has not been stopped, the TDR edge stabilization calibration is performed again and another acquisition cycle of "N" TDR waveform samples is acquired for each enabled TDR channel. This process of TDR edge stabilization calibration and acquisition of "N" TDR waveform samples for each enabled TDR channel continues until the oscilloscope acquisitions are stopped.

Figure 4A:
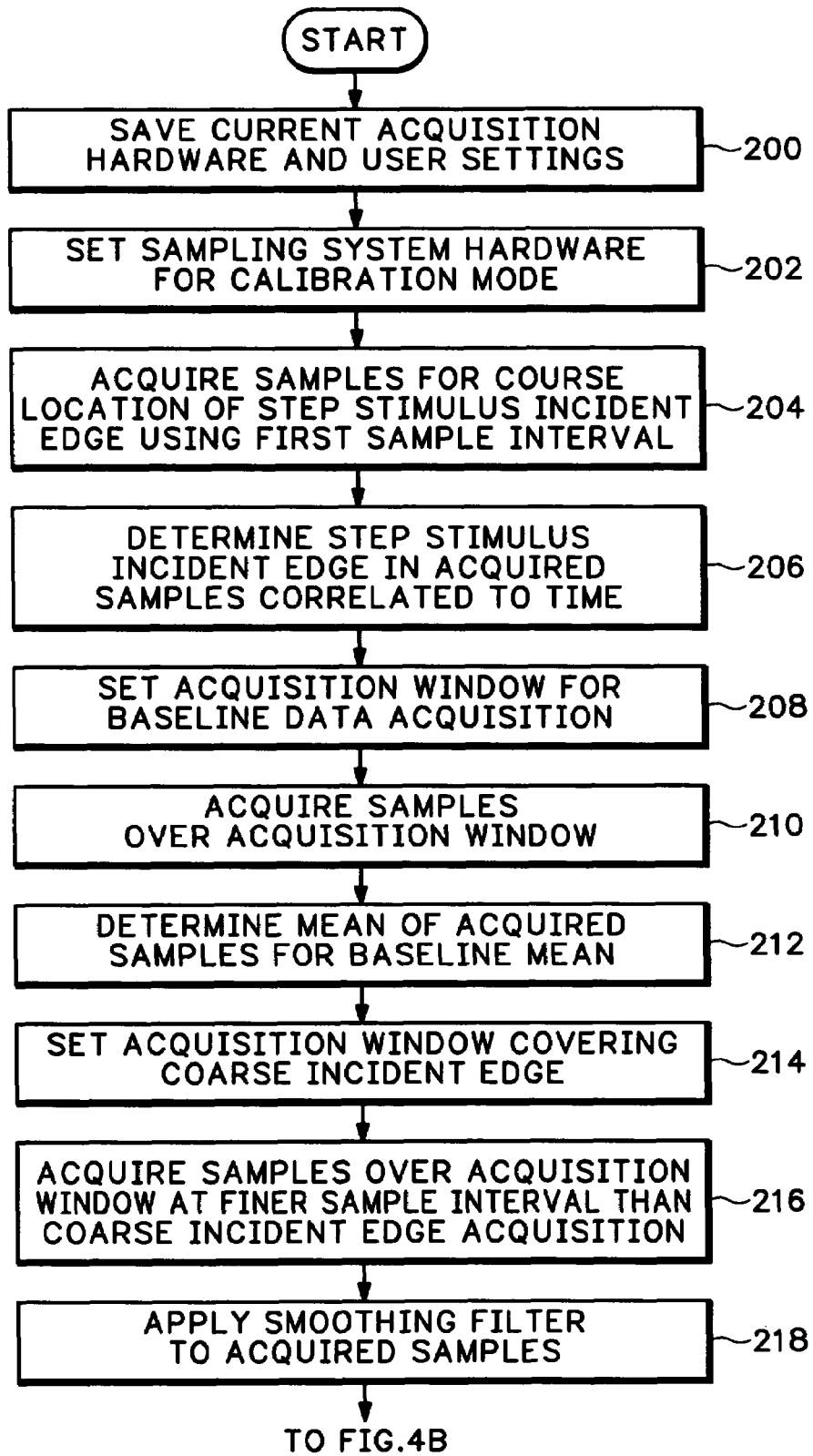
Figure 4B:
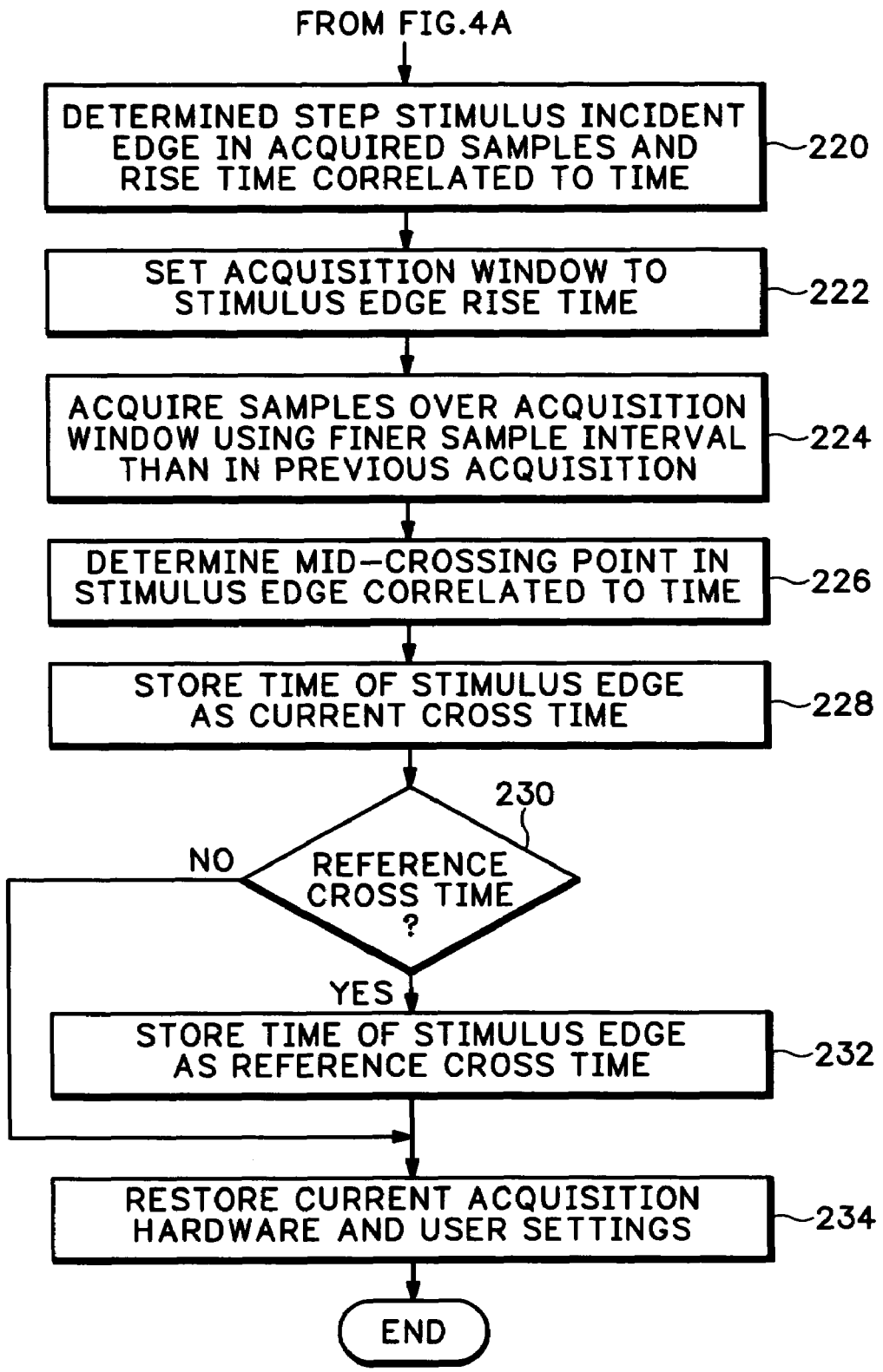

Referring to FIGS. 4A through 4C, there is shown a flow chart of the TDR edge stabilization algorithm. In step 200, the current acquisition hardware and user setting are saved. In step 202, the sampling system is set to calibration mode. Various hardware setting are changed including vertical offset, record length, sampling interval, time of initial strobe delay, and acquisition mode. The initial position is reset to the minimum setting and an acquisition record of 64 ns with a sample resolution of 128 ps is obtained as represented by set 204. Based on the step stimulus polarity, and programmed vertical offset, the sample data is examined to find the first amplitude change in the sample date as represented by step 206. Due to system noise, a significant amplitude change is required and in the current implementation, it is approximately 125 mV (one-half the normal step amplitude). The position of the amplitude change is correlated to time.

Figure 5:
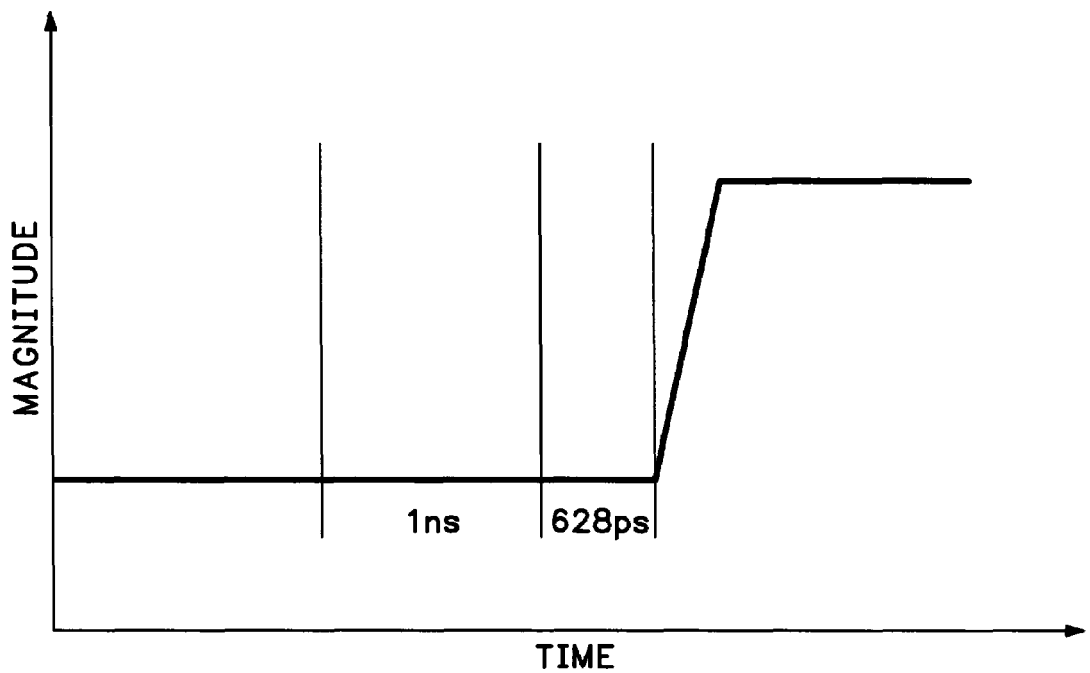
FIG. 5 is a waveform display representation of the acquisition window for determining the baseline mean in the method of real-time time drift adjustment for a TDR step stimulus according to the present invention.

The next step is to obtain a more accurate measurement of the baseline signal that precedes the step stimulus incident edge. In the current embodiment, an acquisition window is set as depicted in step 208 for acquiring the baseline sample data. The acquisition window is set to 1 ns and the time of the last sample point for the window is 628 ps, relative to the previously measured coarse location of the incident step stimulus edge as representatively shown in FIG. 5. The data samples are acquired over the acquisition window as represented in step 210 and the mean of the sample data is determined and becomes a baseline mean measurement as shown in step 212.

Figure 6:
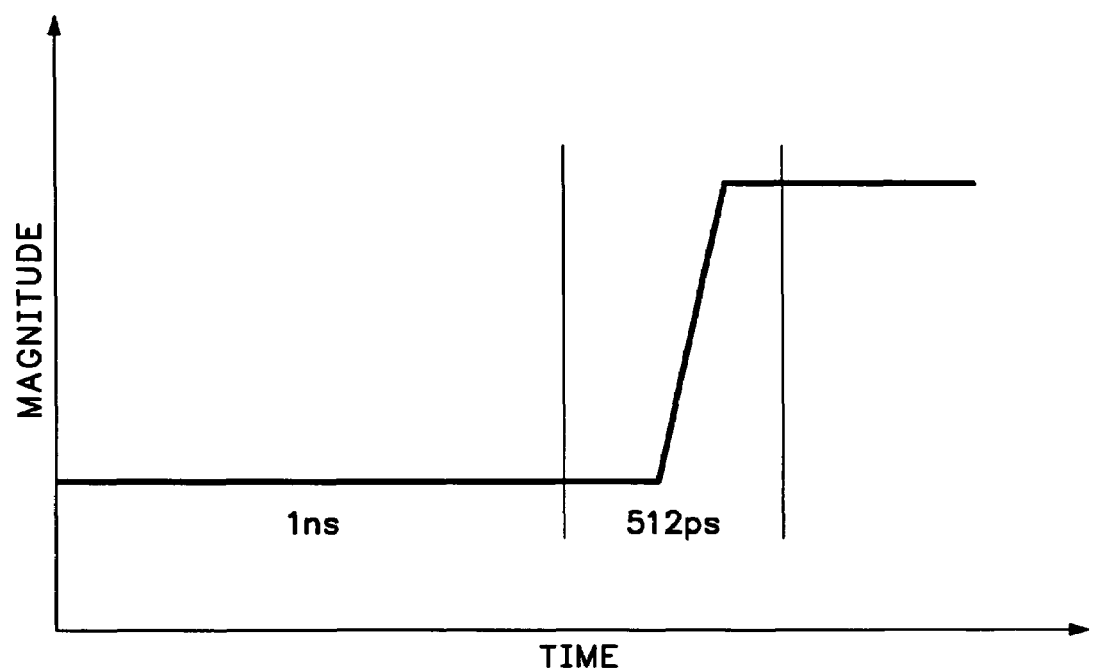
FIG. 6 is a waveform display representation of the acquisition window covering the coarse step stimulus incident edge in the method of real-time time drift adjustment for a TDR step stimulus according to the present invention.

The next step is to acquire a more accurate measurement of the step stimulus incident edge. Based on the coarse measurement of the step stimulus incident edge, an acquisition window around this position is determined as shown in step 214 as representatively shown in FIG. 6. Sample data is acquired over the acquisition window as shown in step 216. In the current implementation, the acquisition window is 512 ps, centered on the coarse step stimulus incident edge with a sample interval of 1 ps. The sample data is applied to a smoothing filter in step 218 which in the present embodiment is a moving average. The step stimulus incident edge is determined as the mid-crossing point by looking for a specific amplitude change from the baseline mean previously determined as shown in step 220. The amplitude change is one-half the nominal step amplitude plus an adjustment due to the smoothing function. The position of the amplitude change is correlated to time. Further, a rise time from 25% to 75% of the step stimulus incident edge is calculated.

Figure 7:
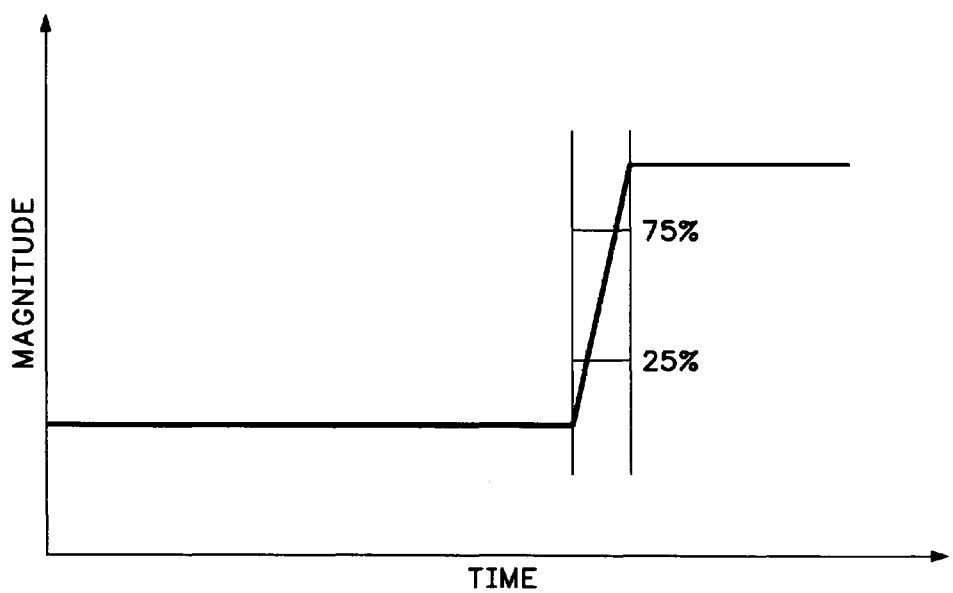
FIG. 7 is a waveform display representation of the acquisition window covering the step stimulus rise time in the method of real-time time drift adjustment for a TDR step stimulus according to the present invention.

The next step uses the previous cross-time of the step stimulus incident edge to set an acquisition window based on the 25% and 75% rise time of the step stimulus incident edge as represented in step 222 and representatively shown in FIG. 7. In the preferred embodiment, the acquisition window is constrained to be a minimum of 4 ps and a maximum of 16 ps. The sample interval for the acquisition window is 32 fs. Sample data is acquired over the acquisition window as shown in step 224. A linear regression is performed on the resulting sample data. The mid-crossing point of the step stimulus incident edge is determined in a fashion similar to the previous steps as shown in step 226. The resulting mid-crossing point of the step stimulus incident edge is stored as the current cross time as shown in step 228. If a reference cross time has not been stored due to the system boot or a clearing of the reference due to various system changes, such as instrument compensation, then the current cross time value is stored as the reference cross time of the step stimulus incident edge as represented by the decision step 230 and storing step 232. The acquisition and user setting previously stored are restored as shown in step 234.

The difference or delta between the current cross time and the reference cross time is calculated and used to adjust the strobe delay as shown in step 110 in FIG. 3. The delta value maybe calculated from the current cross time and the reference cross time and stored for use in each acquisition cycle of digital data samples. This strobe delay adjustment is sent to the controller 46 to adjust the programmed initial strobe delay time as derived from the user's initial position input. This adjustment is made each time a new acquisition cycle of waveform samples is acquired for each enabled TDR channel. The sampling system acquires acquisition cycles of TDR waveform samples with the strobe delay adjustment until the TDR edge stabilization calibration is performed again.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method for reducing drift in a step stimulus provided to a sampling system comprising the steps of:
    a) setting a calibration repetition rate;
    b) acquiring step stimulus waveform samples at a first sample interval and determining a mid-crossing point in a step stimulus edge correlated in time;
    c) setting a baseline acquisition window, acquiring step stimulus waveform samples and determining a base line mean over the baseline acquisition window;
    d) setting a step stimulus edge acquisition window centered on the mid-crossing point in the step stimulus edge correlated in time, acquiring step stimulus waveform samples at a second sample interval smaller than the first sample interval, and determining a mid-crossing point in a step stimulus edge correlated in time and a rise time of the step stimulus edge over a selected portion of the step stimulus edge;
    e) setting a step stimulus edge acquisition window based on the rise time of the step stimulus edge, acquiring step stimulus waveform samples at a third sample interval smaller than the second sample interval, and determining a mid-crossing point in a step stimulus edge within the acquisition window correlated in time;
    f) storing the mid-crossing point in a step stimulus edge in step d) as the reference mid-crossing point and the current mid-crossing point;
    g) adjusting an initial strobe delay interval in the sampling system using the difference between the reference mid-crossing time and the current mid-crossing time;

h) acquiring acquisition cycles of TDR/TDT waveform samples equal to the repetition rate using the adjusted initial strobe delay interval;

i) performing a further step stimulus stabilization calibration on a new set of acquired step stimulus waveform samples using steps b), c), d), e) and f) to generate a new current mid-crossing time; and j) repeating steps g), h), and i).

2. The method for reducing drift in a step stimulus provided to a sampling system as recited in claim 1 wherein the adjusting an initial strobe delay interval step further comprises the step of storing the difference between the reference mid-crossing time and the current mid-crossing time.

3. The method for reducing drift in a step stimulus provided to a sampling system as recited in claim 1 wherein the determining a mid-crossing point in a step stimulus edge correlated in time in step d) further comprises applying a smoothing filter on the step stimulus waveform samples in the step stimulus edge acquisition window.

4. The method for reducing drift in a step stimulus provided to a sampling system as recited in claim 1 wherein the determining the rise time of the step stimulus edge in step d) further comprises the step of establishing the selected portion of the step stimulus edge as 25% to 75% of the step stimulus edge.

5. The method for reducing drift in a step stimulus provided to a sampling system as recited in claim 1 wherein the determining a mid-crossing point in a step stimulus edge in step e) further comprises the step of performing a linear regression function on the step stimulus waveform samples in the step stimulus edge acquisition window.

\* \* \* \* \*